(12) United States Patent
Loopstra et al.

(10) Patent No.: US 7,710,540 B2
(45) Date of Patent: May 4, 2010

(54) LITHOGRAPHIC APPARATUS AND DEVICE MANUFACTURING METHOD

(75) Inventors: Erik Roelof Loopstra, Heeze (NL); Henrikus Herman Marie Cox, Eindhoven (NL); Jeroen Johannes Sophia Maria Mertens, Duizel (NL); Wilhelmus Franciscus Johannes Simons, Beesel (NL); Paul Petrus Joannes Berkvens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 341 days.

(21) Appl. No.: 11/783,115

(22) Filed: Apr. 5, 2007

(65) Prior Publication Data

US 2008/0246936 A1    Oct. 9, 2008

(51) Int. Cl.
*G03B 27/42* (2006.01)

(52) U.S. Cl. ............................. 355/53; 355/72; 355/75; 355/77; 700/213

(58) Field of Classification Search ............... 355/53, 355/72–77, 52, 55; 250/492.1, 492.2, 492.22, 250/442.11; 430/311; 248/550; 318/649, 318/638; 700/213
See application file for complete search history.

(56) References Cited

U.S. PATENT DOCUMENTS

| | | | |
|---|---|---|---|
| 5,184,055 A | 2/1993 | Ohishi et al. | |
| 5,828,573 A * | 10/1998 | Hayashi | 700/121 |
| 5,900,707 A * | 5/1999 | Wakui | 318/625 |
| 6,025,688 A * | 2/2000 | Sekiguchi | 318/610 |
| 6,472,840 B1 * | 10/2002 | Takahashi | 318/649 |
| 6,924,884 B2 | 8/2005 | Boonman et al. | |
| 7,019,815 B2 | 3/2006 | Jasper et al. | |
| 2002/0044269 A1 * | 4/2002 | Yonekawa et al. | 355/53 |
| 2002/0101253 A1 | 8/2002 | Plenter et al. | |

(Continued)

FOREIGN PATENT DOCUMENTS

EP    1111472 A2    6/2001

(Continued)

OTHER PUBLICATIONS

Search Report issued on Aug. 18, 2008 in corresponding European Application No. 08075225.

(Continued)

*Primary Examiner*—Edward J Glick
*Assistant Examiner*—Christina Riddle
(74) *Attorney, Agent, or Firm*—Pillsbury Winthrop Shaw Pittman LLP

(57) ABSTRACT

A position control system for a substrate support of a lithographic apparatus includes a position measurement system configured to determine a position of a sensor or sensor target on the substrate support, a controller configured to provide a control signal based on a desired position of a target portion of the substrate and the determined position, and one or more actuators configured to act on the substrate support. The position control system includes a stiffness compensation model of the substrate support, the stiffness compensation model including a relation between a difference in a change in position of the target portion and a change in position of the sensor or sensor target as a result of a force exerted on the substrate support. The position control system is configured to substantially correct at least during projection of a patterned radiation beam on the target portion, the position of the target portion using the stiffness compensation model.

24 Claims, 5 Drawing Sheets

U.S. PATENT DOCUMENTS

| | | |
|---|---|---|
| 2003/0147062 A1* | 8/2003 | Morisada .................... 355/72 |
| 2004/0164253 A1* | 8/2004 | Ito ........................ 250/491.1 |
| 2005/0110970 A1* | 5/2005 | Butler ....................... 355/53 |
| 2005/0259233 A1* | 11/2005 | Streefkerk et al. ........... 355/53 |
| 2006/0072089 A1 | 4/2006 | Eussen et al. |
| 2006/0119829 A1 | 6/2006 | Cox et al. |
| 2006/0139613 A1 | 6/2006 | Houkes et al. |

FOREIGN PATENT DOCUMENTS

| | | |
|---|---|---|
| EP | 1677151 A1 | 7/2006 |
| WO | 03003132 A1 | 1/2003 |

OTHER PUBLICATIONS

Search Report issued for Singapore Patent Application No. 200802524-9, dated May 13, 2009.

* cited by examiner

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known lithographic apparatus includes a position control system to control the position of the substrate support. This position control system includes a position measurement system which is configured to measure a number of sensor or sensor target positions of the substrate support.

During use of the lithographic apparatus forces will be exerted on the substrate support. For instance, during the exposure phase, i.e. during projection of the patterned beam on a target portion of the substrate level, level actuations may be performed to position the upper surface of the substrate in a correct orientation with respect to the lens column or projection system. As the stiffness of the substrate support is limited, the level actuations may cause temporary deformations of the substrate support. Such deformations may lead to focus errors and/or offset in overlay.

A known embodiment of the lithographic apparatus includes a liquid confinement system which provides a liquid between the substrate and a final element of the projection system to obtain more suitable breaking indices between these elements in order to improve the product quality. Such liquid confinement system or the liquid itself may also during the exposure phase exert forces on the substrate and therewith on the substrate support. These external forces exerted by the liquid confinement system may also result to temporary deformations in the substrate support and can therefore result in focus errors and/or offset in overlay.

To reduce the risk on deformations of the substrate table and as a consequence focus errors or overlay offset, it has been proposed to increase the stiffness of the substrate support. However, the increasing demand on accuracy and speed of the positioning of the substrate support, the possibilities to increase the stiffness of the substrate support without encountering further problems, for instance with respect to weight may have come to their limits.

SUMMARY

It is desirable to provide a position control system for a lithographic apparatus in which the accuracy of the positioning of the target portion with respect to the lens column or projection system may be improved.

In an embodiment of the invention, there is provided a lithographic apparatus including an illumination system configured to condition a radiation beam; a patterning device capable of imparting the radiation beam with a pattern in its cross-section to form a patterned radiation beam; a substrate support constructed to hold a substrate; and a projection system configured to project the patterned radiation beam onto a target portion of the substrate, wherein the lithographic apparatus includes a position control system configured to control a position of the target portion, wherein the position control system includes: a position measurement system configured to determine a position of a sensor or sensor target on the substrate support, a controller configured to provide a control signal based on a desired position and the determined position, and one or more actuators configured to act on the substrate support, wherein the position control system includes a stiffness compensation model of the substrate support, the stiffness compensation model including a relation between a force exerted on the substrate support and a resulting position error of the target portion, wherein the position control system is configured to substantially correct at least during the projection of the patterned radiation beam on the target portion, the position of the target portion using the stiffness compensation model.

In an embodiment of the invention, there is provided a position control system configured to control a specific location on a movable object, including: a position measurement system configured to determine a position of a sensor or sensor target on the movable object, a controller configured to provide a control signal based on a desired position and the determined position, and one or more actuators configured to act on the movable object, wherein the position control system includes a stiffness compensation model of the movable object, the stiffness compensation model including a relation between a force exerted on the movable object and a resulting position error of the specific location on the movable object, and wherein the position control system is configured to correct the position of the specific location using the stiffness compensation model.

In an embodiment of the invention, there is provided a lithographic apparatus including: an illumination system configured to condition a radiation beam; a patterning device support constructed to support a patterning device, the patterning device capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes a position control system configured to control a pattern position of the pattern device, wherein the position control system includes: a position measurement system configured to determine a position of a sensor or sensor target on the pattern device support, a controller configured to provide a control signal based on a desired position and the determined position, and one or more actuators configured to act on the pattern device support, wherein the position control system includes a stiffness compensation model of the pattern device support, the stiffness compensation model including a relation between a force exerted on the pattern device support and a resulting position error of the pattern position, wherein the position control system is configured to substantially correct at least during imparting the radiation beam with a pattern, the position of the pattern position using the stiffness compensation model.

In an embodiment of the invention, there is provided a method for controlling the position of a target portion of a substrate supported on a substrate support, the target portion to be projected with a patterned beam of radiation, wherein position control of the target portion includes correcting position errors of the target portion the correcting including determining force signals representative for forces exerted on the substrate table and/or the substrate, feeding the force signals to a stiffness compensation model of the substrate support, and using an output of the stiffness compensation model for correcting position errors of the target portion.

The stiffness compensation model of the substrate support may include a relation between a force exerted on the substrate support and a resulting position error of the target portion.

In an embodiment of the invention, there is provided a calibration method for determining a stiffness compensation model of a substrate support. The stiffness compensation model of the substrate support may include a relation between a force exerted on the substrate support and a resulting position error of a target portion of the substrate. The method includes exerting in each of the number of positions of the substrate support a number of disturbance forces on the substrate support, determining a frequency response function between the disturbance forces and a resulting change in position of the target portion, generating for each of the number of positions a compensation gain matrix, or generating a compensation gain matrix, each compensation gain being dependent on the position of the substrate support.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
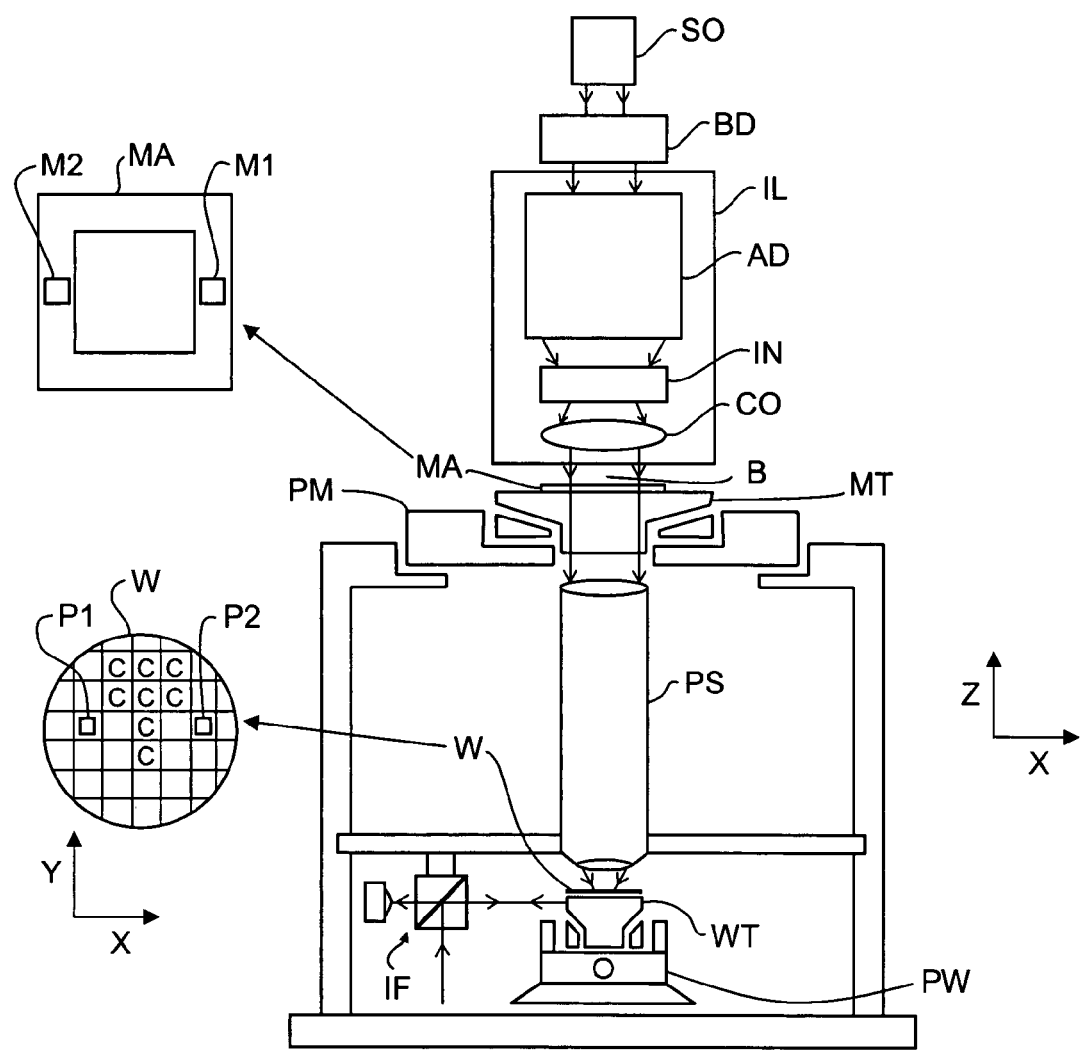
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or pattern support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure or pattern support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "pattern support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "pattern support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "pattern support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
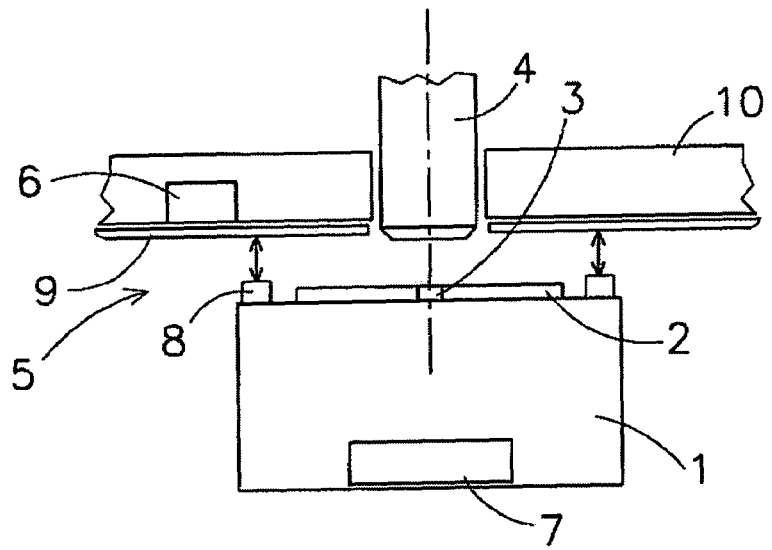
FIG. 2 depicts a stage of a lithographic apparatus according to an embodiment of the invention.

FIG. 2 shows a substrate support 1 supporting a substrate 2. The substrate is subdivided in a number of target portions 3 as shown in FIG. 1 on which subsequently a patterned beam is projected with a projection system 4.

A position control system is provided to control the position of the substrate support 2 in order to subsequently position the different target portions 3 of the substrate 2 with respect to the projection system 4. For this reason the substrate support 1 is movable in a number of degrees of freedom, typically three coplanar degrees of freedom (in a plane substantially parallel to the substrate) or in six degrees of freedom.

The position control system includes a position measurement system 5 to measure the position of the substrate support in a suitable degrees of freedom, a controller 6 to provide control signals at least on the basis of the position measured by the position measurement system, and one or more actuators 7 to actuate the substrate support 1 in a desired direction.

The position measurement system 5 is provided to measure the position of the substrate support 1, and may for instance be an interferometer system or an encoder-type measurement system. The position measurement system 5 includes a number of sensors 8, for instance encoder-type sensors, mounted on the substrate support 1 and a number of sensor targets 9 mounted on a substantially stationary frame 10. In an alternative embodiment, the sensors may be mounted on the metro-frame 10 while the sensor targets are mounted on the substrate support 1. Any other type of measurement suitable to measure the position of the substrate support with high accuracy (nanometer accuracy) may be applied.

The controller includes a subtractor wherein the actual position of the substrate support 2 is subtracted from a desired position which is for instance given by a set-point generator. The resulting signal which is often referred to as servo error is fed into a controller unit which provides on the basis of the input of the controller unit a control signal which is fed to the actuator to actuate the substrate support 1 to a desired position.

The controller may further include a feed-forward device. Such feed-forward device may provide a feed-forward signal on the basis of a set-point signal or other reference signal. In such case an addition device is arranged usually between the controller unit and the actuator where the control signal and the feed-forward signal are added to provide a second control signal which is fed to the actuator 7.

The actuator 7 may be any actuator which is capable of moving the substrate support 2 in a desired direction. The actuators may be configured to actuate the substrate support in one or more degrees of freedom. Two or more actuators may be provided for actuation in different degrees of freedom or for actuation at different locations on the substrate support 1. Such actuators and actuator arrangements are known in the art.

The above position control system has been described with respect to one degree of freedom. In practice, the position control system will be configured to control the position of the substrate support in a number of degrees of freedom, typically 3 co-planar degrees of freedom or six degrees of freedom. For this reason, the position control system 3 may include an arrangement of on or multidimensional sensors configured to measure the position of the substrate support in the desired number of degrees of freedom, as well as an arrangement of one or multi-dimensional actuators to make positioning of the substrate support in al desired degrees of freedom possible.

Furthermore, the position control system 3 as described above is directed at a control system to control the position of the substrate support. Similar systems may be provided to control the speed, acceleration or other relevant position related quantity of the substrate support.

A position measurement system 5 as described above is generally known. However, this position control system may not take into account the internal flexibility of the substrate support. When forces are exerted on the substrate support, the substrate support may temporarily deform. As a result, a change of position of one location of the substrate support does not automatically result in a corresponding change of position of another location of the substrate support. Such difference caused by the internal flexibility of the substrate support may be in the same degree of freedom, but also in different degrees of freedom, a so-called cross-talk effect.

In general, there are three relevant locations on the substrate support which are relevant for the position control of the substrate support, when the flexibility of the substrate support has to be taken into account. The first location is the position of the sensor or sensor target mounted on the substrate support. At this location the actual position of the substrate support is determined. A second location of importance is the location of the target portion of the substrate, since the goal of position control of the substrate support is to control the position of the target portion 3 with respect to the projection system 4. A third location of importance is the location where a force is exerted on the substrate support.

When an actuation force, or another force, is exerted on the substrate support, due to the internal flexibility of the substrate support the change in position of the first location and the second location may be different. The controller will normally control the position of the substrate support on the basis of the first location as this is the position of the sensor or sensor target of the position measurement system. Such correction may for instance be performed using a feed-forward device.

However, although the control action may substantially improve the positioning of this first location, it may have a different effect on the second location. Since the flexibility of the substrate support between the third location and the second location may be different than the flexibility of the substrate support between the first location and the second location. Nevertheless it is desirable to actually control the position of the second, i.e. the target portion, as this is the actual location where a image is projected on the substrate.

In order to take the limited stiffness, i.e. the flexibility, of the substrate support into account, the position control system includes a stiffness compensation model which includes a relation between a force exerted on the substrate support and a resulting difference of change in position of the target portion and the sensor or sensor target. The stiffness compensation model may be arranged in a feed-forward part or in a feedback part of the control loop or in a combination of feedforward or feedback. Arrangement in the feed-forward loop may be preferable in view of control stability.

Figure 3:
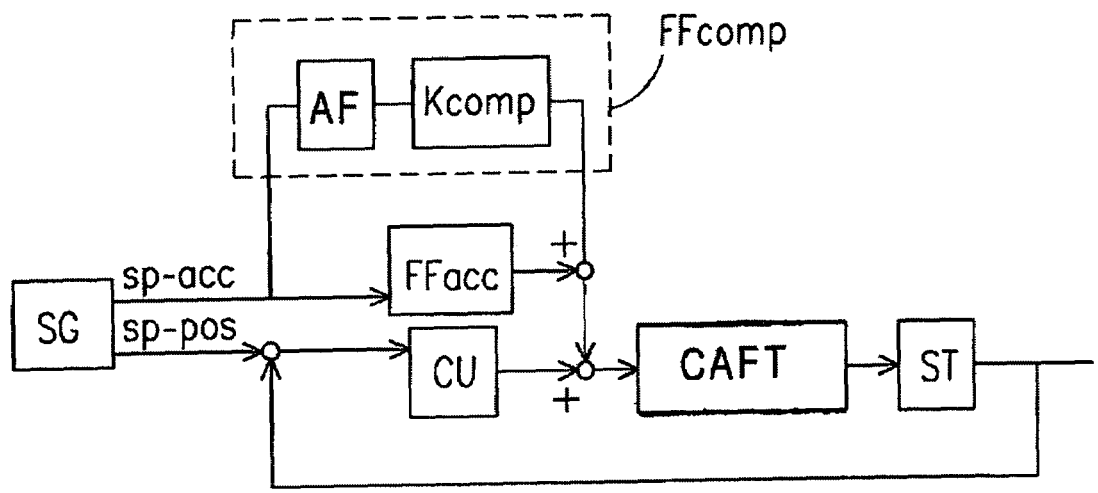
FIG. 3 depicts schematically a control scheme of a lithographic apparatus according for the embodiment of FIG. 2.

In FIG. 3, a multivariable control scheme of a position control system including a stiffness compensation model in a feed-forward device is shown.

The control scheme of FIG. 3 is designed to compensate for errors in the position of the target portion as a result of forces which are exerted for level actuations during the projection phase of a patterned beam on a target portion of a substrate, in combination with the flexibility of the substrate stage. These level actuations are made to take into account the irregularities of the top surface of the substrate. During a so called measuring phase, before the projection phase, a height map of the substrate target portions, is made of these irregularities and during the projection phase the substrate is moved to properly locate the substrate with respect to the projection system. Such leveling is described in more detail in U.S. Pat. No. 6,924,884, the contents of which are herein incorporated by reference, and U.S. Pat. No. 7,019,815, the contents of which are herein incorporated by reference.

In the control scheme of FIG. 3, a set-point generator SG generates a position set-point sp-pos and an acceleration set-point sp-acc for the substrate support. The actual position of the substrate support as measured by the position measurement system is subtracted from the position set-point in a subtractor and fed to a controller unit CU which provides on the basis of this difference between actual position and set-point position, i.e. the servo error, a control force signal. The acceleration set-point sp-acc of the set-point generator SG is fed into an acceleration feed-forward unit FFacc which generates a feed-forward signal which is added to the control signal and fed to a control signal to actuator force transformation block CAFT that transforms the de-coupled controller forces to force signals for the individual actuators to de-couple the six degrees of freedom MIMO mechanics of the substrate support in order to reduce cross talk-coupling matrices. The resulting signal is fed to the actuator or actuators of the substrate support for actuation of the substrate support ST to the desired position.

Further, in the feed-forward device a stiffness compensation model FFcomp is provided to compensate the difference between the deformation of the substrate support at the location(s) of the sensor(s) and the deformation at the location of the target portion as a result of the forces being exerted on the substrate support for the leveling of the substrate support ST. As the (multi-dimensional) acceleration set-point is a representative signal for the force actuated on the substrate support, this acceleration set-point is used as a force signal which is fed into the stiffness compensation matrix. Before being actually fed into the compensation gain matrix, the acceleration set-point passes a filter AF, e.g. a second order high pass filter which works as a second order differentiator to convert the acceleration set-point signal in a signal representative for the position change due to flexibility of the substrate support at the target portion.

The compensation gain matrix includes a 6×6 matrix Kcomp including a compensation gain for each relation between a force in one of the six degrees of freedom and a resulting compensation of the position of the target portion in one of the six degrees of freedom. As the amount of compensation also depends on the actual position of the substrate support, a matrix may be provided for a number of positions of the substrate support. As the movements of the substrate support during scanning are mainly two-dimensional in the plane perpendicular to the axis of projection (often called the z-direction), compensation gain matrices may be provided for a number of positions of the substrate support in this two dimensional plane (x-y-plane). A real-time calculation device may be provided to calculate the compensation gains for positions in between the number of positions for which compensation gain matrices are determined.

In alternative embodiments a single compensation gain matrix may be provided, wherein the compensation gains are a function of the actual position of the substrate support.

The compensation gains are chosen such that the difference between the change in position of the target portion and the change of position of the sensor mounted on the substrate support as a result of an actuation force being exerted on the substrate support is compensates to position the target portion to be irradiated by the projection system in the substantially correct position. Since the compensation matrix is a multi-dimensional matrix this correction may be performed in the same degree of freedom, for instance actuation and correction in y-direction, but also in a different direction, for instance a torque actuation in Rz direction and a correction in z-direction. In general actuation in each of the controlled degrees of freedom may lead to a position correction in the same or each other degree of freedom.

By the above correction of the position by using the control scheme of FIG. 3, the position control of the target portion of the substrate supported on the substrate support is improved, resulting in a better overlay and/or focus.

In an embodiment of the invention, a calibration method may be used to obtain a stiffness compensation model as described above. It will be appreciated for the man skilled in the art that in order to obtain a proper position control of the target portion, i.e. error compensation, the compensation gains of the stiffness compensation model have to be determined. The calibration method of the substrate support for obtaining a stiffness compensation model will now be described in more detail.

Figure 4:
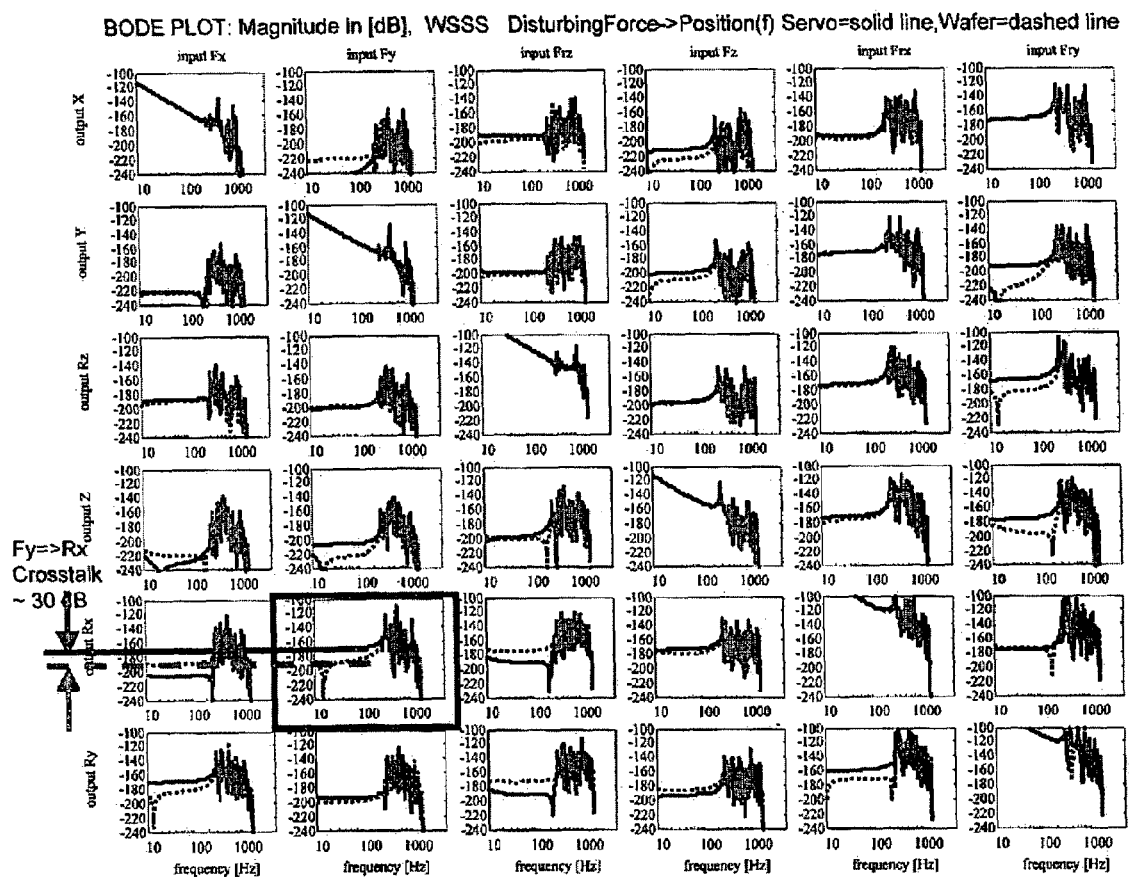
FIG. 4 depicts a frequency transfer function matrix describing relation between servo and target portion error as a result of acceleration forces on the substrate support determined for a position of the substrate support in accordance with an embodiment of the invention.
Figure 5:
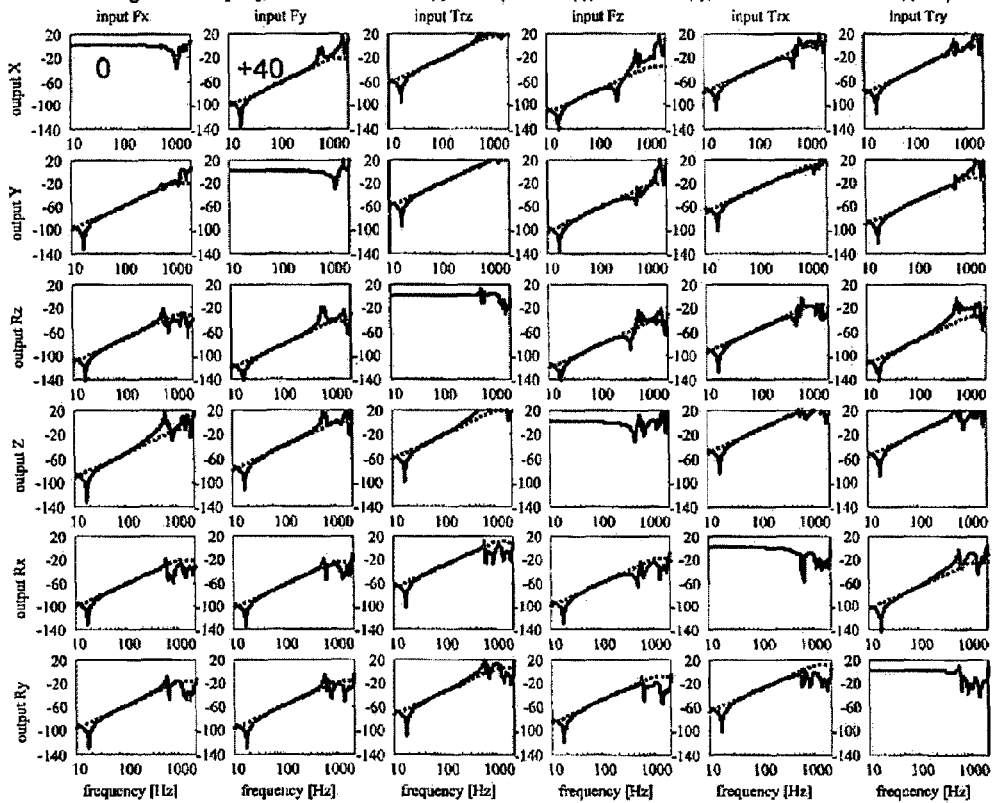
FIG. 5 depicts a stiffness compensation model according to an embodiment of the invention.

FIG. 4 shows a 6×6 matrix of bode plots describing a frequency transfer function for six input forces/accelerations (Fx, Fy, Frz, Fz, Frx, Fry) to six position outputs (x, y, Rz, z, Rx, Ry) of the servo error (solid line) in comparison with error of the target portion of the substrate on the substrate support (dashed line). These transfer functions can be obtained in an arrangement in which both the position of the sensor(s) (servo) and the position of the target portion (wafer) may be measured, whereby subsequently the specific input forces are introduced to the substrate table. In particular, in the off-diagonal transfer functions, i.e. from an input in a degree of freedom to an output in another degree of freedom, the flexibility of the substrate support becomes clear. The transfer functions show that for some input-output combinations the difference in sensitivity at the location of the sensor (servo) and the target portion (wafer) may be as large as 3 dB or even 10 dB. It is remarked that at high frequencies, above 800-1500 Hz, the internal eigen frequencies start to dominate the transfer functions.

Similar transfer functions may be obtained for different positions of the substrate support. As the substrate support, at least during the exposure phase, mainly moves in the x-y plane, the transfer functions may be determined for a number of positions in the x-y plane. It is remarked that a certain number of positions of the substrate support relate to a specific target portion as in these positions of the substrate support this specific target portion is positioned under the projection system and is to be illuminated.

In substantially the same arrangement the effect of other forces exerted on the substrate or substrate support on the positions of the sensor(s) and the target portion may be obtained.

In a next step, the transfer function matrices including position deformation as function of the forces/accelerations is translated into a compensation matrix. This can be done by multiplying the complex inverse transfer function of the substrate support, or more general the mechanics of the movable object to be controlled, with the desired ideal transfer function. The resulting compensation model (shown in solid lines) is a frequency dependent transfer function matrix for each measured x-y position of the substrate support. It is desirable to obtain a more compact compensation matrix. Such matrix can be obtained by fitting a real function on the calculated compensation matrix (dashed lines). The diagonal transfer functions (from one degree of freedom input to same degree of freedom output) have a unity gain over the relevant frequency range. The off-diagonal terms can be approximated by a second order high pass filter with a +40 dB/decade slope.

Based on these approximations of the calculated compensation matrix a real compensation matrix for each x-y position of the substrate support is obtained.

An algorithm, for instance an interpolation algorithm may be provided to calculate the compensation matrix for non-measured positions of the substrate support, wherein the calculations for instance are bases on values of adjacent measured positions of the substrate support.

With respect to the above calibration method it is remarked that any missing information regarding the position measurement of the target portion during calibration for some degrees of freedom, the missing frequency response functions may be fitted on the basis of the information in the other degrees of freedom. However, it is preferable to measure positions of both the target position and the sensor/sensor target to obtain optimal compensation.

The position control system according to an embodiment of the invention may also used for compensation of the positioning error of a target portion of a substrate support due to the effect of another force exerted on the substrate or substrate support in combination with the flexibility of the substrate support. For instance, in a lithographic apparatus in which a liquid confinement system is used to provide a quantity of liquid between a target portion of a substrate and a final lens element of the projection system, the liquid confinement system may exert a force on the substrate and/or substrate support. This force may be caused by movement of the liquid confinement system itself, liquid flow within the system, effects of the gas used to maintain the liquid in the desired location, or by movement of the substrate support with respect to the liquid confinement system.

It is known to estimate the forces exerted by a liquid confinement system on a substrate support, by using the position of the liquid confinement system/servo error and the control signal of a position control system of the liquid confinement system. Such estimation model is described in U.S. application Ser. No. 11/022,950, published as US2006/139613, the contents of which are herein incorporated by reference.

In the control system described in U.S. Ser. No. 11/022,950 the estimated force is fed forward to the position control system of the substrate support in order to provide a compensation force for the force exerted on the substrate support. However, in this control system the limited stiffness/flexibility of the substrate support is not taken into account, which may cause focus and/or overlay errors.

Figure 6:
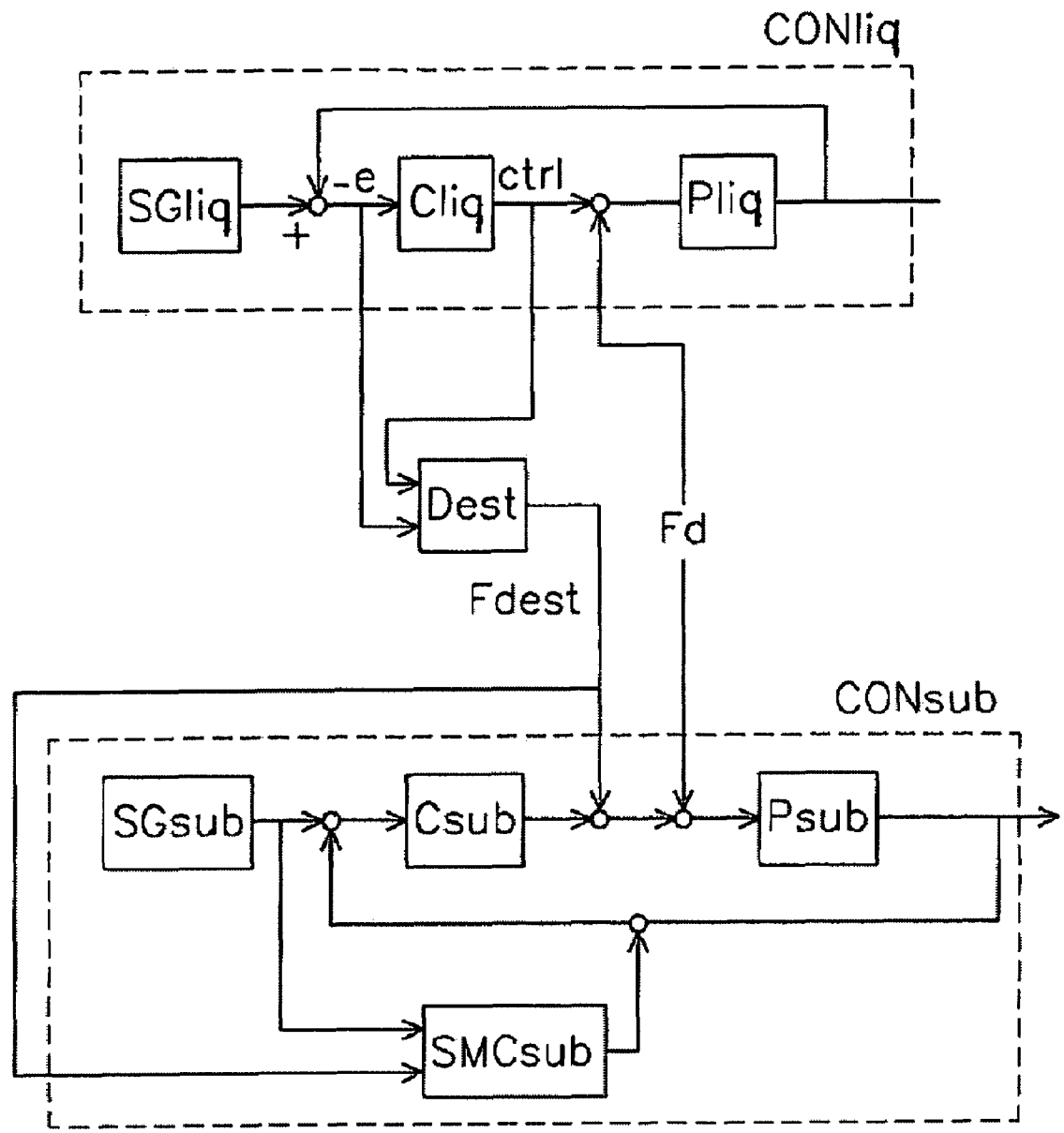
FIG. 6 depicts a control scheme for a lithographic apparatus according to an embodiment of the invention including a liquid confinement system.

FIG. 6 shows a (simplified) control scheme according to an embodiment of the present invention. This control scheme shows a control scheme part CONliq for position control of the liquid confinement system including a setpoint-generator SGliq, a controller unit Cliq and the mechanics of the liquid confinement system Pliq. The disturbance force exerted on the liquid confinement system, which is also exerted in the opposed direction on the substrate/substrate support is indicated with Fd. On the basis of the servo error e and the control signal ctrl of the controller unit Cliq, the disturbance estimator Dest estimates the disturbance force Fdest.

The control scheme part of the substrate support CONsub, includes a set-point generator SGsub, a controller unit Csub, and the mechanics of the substrate support Psub. The disturbance force Fd is added as −Fd in the control scheme as the force is opposed to the force exerted on the liquid confinement system.

To compensate the position of the substrate support, as is described in U.S. patent application Ser. No. 11/022,950 the estimated disturbance force Fdest is subtracted from the control signal of the substrate support controller Csub to compensate for the disturbance force exerted on the substrate support. However, this compensation force may not take into account the limited stiffness of the substrate support.

Therefore, in accordance with an embodiment of the present invention, the estimated force is also fed to the stiffness compensation model SCMsub to calculate a compensation signal to be fed into the control loop of the substrate support. By taking into account the flexibility of the substrate support the target portion may be positioned more accurately, and as a result the chance on focus and/or overlay errors is substantially decreased.

Since the values of the stiffness compensation model depend on the actual position of the substrate support, at least in the x-y plane, the set point position is also fed in the stiffness compensation model SCMsub. In an alternative embodiment, the actual position of the substrate support may be fed into the stiffness compensation model SCMsub.

Furthermore, instead of estimating the force on the basis of a servo error and control signal of the liquid confinement system position control system, the force to be fed into the stiffness compensation model may be calculated or measured.

In the above description a stiffness compensation model has been described for compensation of the position error of a target portion of a substrate as a result of flexibility. A calibration method has been described for obtaining this stiffness compensation model. Any other suitable method for obtaining the stiffness compensation model, for instance finite element modeling, may be used and is regarded to fall within the scope of the present invention.

In the above-described embodiments, the flexibility of the substrate support has been taken into account for the positioning of the target portion of a substrate supported on the substrate support with respect to forces exerted on the substrate support at least during exposure phase of the lithographic apparatus. Examples of these forces are the actuation forces for leveling and the forces exerted by the presence of a liquid confinement system. It will be appreciated for the man skilled in the art that the stiffness compensation model in accordance with an embodiment of the invention may also be used for position compensation of the target portion with respect to any other external force exerted on the substrate support, when it is possible to calculate, measure or estimate this external force so that is can be fed into the stiffness compensation model. All such embodiments are deemed to fall within the scope of the present invention.

The position control system according to an embodiment of the invention may also be applied for the position control of a specific location of a movable object in case the limited stiffness/flexibility of the movable object should be taken into account.

The position control system may be realized as software in a computer program, or as a hardware control system, or a combination thereof, or any other type of suitable control system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a patterning device capable of imparting the radiation beam with a pattern in said radiation beam cross-section to form a patterned radiation beam;
    a substrate support constructed to hold a substrate;
    a projection system configured to project the patterned radiation beam onto a target portion of the substrate; and
    a position control system configured to control a position of the target portion of the substrate, the position control system comprising
        a position measurement system configured to determine a position of a sensor or sensor target on the substrate support,
        a controller configured to provide a control signal based on a desired position of the target portion and the determined position; and
        one or more actuators configured to act on the substrate support,
        wherein the position control system comprises a stiffness compensation model of the substrate support, the stiffness compensation model comprising a relation between a force exerted on the substrate support and a resulting position error of the target portion, the resulting position error of the target portion corresponding to a difference of change in position between the target portion and the sensor or sensor target resulting from the exerted force on the substrate support, the position control system configured to substantially correct at least during projection of the patterned radiation beam on the target portion, the position of the target portion using the stiffness compensation model.

2. The lithographic apparatus of claim 1, wherein the stiffness compensation model comprises one or more compensation gains for a plurality of positions of the substrate support, each compensation gain being dependent on a relation between a force signal and a resulting position error of the target portion.

3. The lithographic apparatus of claim 2, wherein each of the compensation gains is based on a transfer function of a force signal to a resulting position error of the target portion.

4. The lithographic apparatus of claim 1, wherein the stiffness compensation model comprises a relation between a force exerted on the substrate support and a resulting difference between a position error of the target portion and a position error of the sensor or sensor target.

5. The lithographic apparatus of claim 4, wherein the stiffness compensation model comprises one or more compensation gains for a plurality of positions of the substrate support, each compensation gain being dependent on a relation between a force signal and a resulting difference in position error of the target portion and a position error of the sensor or sensor target.

6. The lithographic apparatus of claim 5, wherein each of the compensation gains is based on a transfer function of a force signal to a resulting difference between a position error of the target portion and a position error the sensor or sensor target.

7. The lithographic apparatus of claim 2, wherein the stiffness compensation model comprises compensation gains based on the relationship of force signals in six degrees of freedom to resulting position changes of the target portion in six degrees of freedom for each of the plurality of positions of the substrate support.

8. The lithographic apparatus of claim 2, wherein the plurality of positions of the target portion extend in two degrees of freedom.

9. The lithographic apparatus of claim 2, wherein the controller comprises a feed-forward device, the stiffness compensation model being part of the feed-forward device, the feed-forward device being configured to provide a feed-forward signal by feeding a force signal or equivalent thereof to the stiffness compensation model.

10. The lithographic apparatus of claim 1, wherein the stiffness compensation model is arranged in a feedback loop of the controller.

11. The lithographic apparatus of claim 1, wherein the stiffness compensation model is arranged in a combination of feed-forward and feedback loop of the controller.

12. The lithographic apparatus of claim 1, wherein the stiffness compensation model comprises a calculation device configured to calculate compensation gains for positions of the substrate support in between the plurality of positions of the substrate support.

13. The lithographic apparatus of claim 1, wherein one or more forces are representative of a force exerted by one of the one or more actuators of the substrate table.

14. The lithographic apparatus of claim 1, wherein one or more forces are representative of a force exerted on the substrate table or substrate by an immersion device.

15. The lithographic apparatus of claim 1, wherein the position control system comprises a filter device configured to obtain the required frequency content of the force signal before feeding it into the stiffness compensation model.

16. The lithographic apparatus of claim 1, wherein the stiffness compensation model is determined using finite element modeling.

17. A position control system configured to control a location on a movable object, the system comprising:

a position measurement system configured to determine a position of a sensor or sensor target on the movable object;

a controller configured to provide a control signal based on a desired position of the location on the movable object and the determined position;

one or more actuators configured to act on the movable object, and a stiffness compensation model of the movable object, the stiffness compensation model comprising a relation between a force exerted on the movable object and a resulting position error of the location on the movable object, the resulting position error of the location of the movable object corresponding to a difference of change in position between the location and the sensor or sensor target resulting from the exerted force on the movable object, the position control system configured to correct the position of the location using the stiffness compensation model.

18. A lithographic apparatus comprising:

an illumination system configured to condition a radiation beam;

a pattern support constructed to support a patterning device, the patterning device capable of imparting the radiation beam with a pattern in said radiation beam cross-section to form a patterned radiation beam;

a substrate table constructed to hold a substrate;

a projection system configured to project the patterned radiation beam onto a target portion of the substrate; and a position control system configured to control a pattern position of the patterning device, the position control system comprising a position measurement system configured to determine a position of a sensor or sensor target on the pattern support, a controller configured to provide a control signal based on a desired position of the pattern position and the determined position, and one or more actuators configured to act on the pattern support, wherein the position control system comprises a stiffness compensation model of the pattern support, the stiffness compensation model comprising a relation between a force exerted on the pattern support and a resulting position error of the pattern position, the resulting position error of the pattern position corresponding to a difference of change in position between the pattern position and the sensor or sensor target resulting from the exerted force on the pattern support, the position control system configured to substantially correct at least during imparting the radiation beam with a pattern, the position of the pattern position using the stiffness compensation model.

19. The lithographic apparatus of claim 18, wherein the stiffness compensation model comprises one or more compensation gains for a plurality of positions of the pattern device support, each compensation gain being dependent on a relation between a force signal and a resulting position error of the pattern position.

20. The lithographic apparatus of claim 19, wherein each of the compensation gains is based on a transfer function of a force signal to a resulting position error of the pattern position.

21. A method for controlling a position of a target portion of a substrate supported on a substrate support, a position of the substrate support being determined using a sensor or sensor target, the target portion to be irradiated with a patterned beam of radiation, the method comprising correcting position errors of the target portion the correcting including determining force signals representative of forces exerted on the substrate support and/or the substrate, feeding the force signals to a stiffness compensation model of the substrate support, the stiffness compensation model comprising a relation between a force exerted on the substrate support and a resulting position error of the target portion, the resulting position error of the target portion corresponding to a difference of change in position between the target portion and the sensor or sensor target resulting from the exerted forces on the substrate support; and using an output of the stiffness compensation model for correcting position errors of the target portion.

22. A calibration method for determining a stiffness compensation model of a substrate support in a lithographic apparatus, the substrate support configured to hold a substrate that includes a target portion, a position of the substrate support being determined using a sensor or sensor target, the stiffness compensation model comprising a relation between a force exerted on the substrate support and a resulting position error of the target portion, the method comprising:

exerting for each of a plurality of positions of the substrate support a plurality of disturbance forces on the substrate support;

determining a frequency response function between the disturbance forces and a resulting position error of the target portion, the resulting position error of the target portion corresponding to a difference of change in position between the target portion and the sensor or sensor target resulting from the exerted forces on the substrate support; and generating for each of the plurality of positions a compensation gain matrix, each compensation gain matrix dependent on the position of the substrate support.

23. The method of claim 22, wherein the generating comprises compensating for missing position signals by fitting a transfer function for the missing position signals.

24. The method of claim 22, wherein the method further comprises determining compensation gain matrices for positions of the substrate support between the plurality of positions of the substrate support by interpolation.

* * * * *